United States Patent
Nahar et al.

(10) Patent No.: US 12,191,354 B2
(45) Date of Patent: Jan. 7, 2025

(54) VERTICAL TRANSISTORS HAVING AT LEAST 50% GRAIN BOUNDARIES OFFSET BETWEEN TOP AND BOTTOM SOURCE/DRAIN REGIONS AND THE CHANNEL REGION THAT IS VERTICALLY THEREBETWEEN

(71) Applicant: Micron Technology, Inc., Boise, ID (US)

(72) Inventors: Manuj Nahar, Boise, ID (US); Vassil N. Antonov, Boise, ID (US); Kamal M. Karda, Boise, ID (US); Michael Mutch, Meridian, ID (US); Hung-Wei Liu, Meridian, ID (US); Jeffery B. Hull, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/860,325

(22) Filed: Jul. 8, 2022

(65) Prior Publication Data
US 2022/0344468 A1  Oct. 27, 2022

Related U.S. Application Data

(62) Division of application No. 16/986,436, filed on Aug. 6, 2020, now Pat. No. 11,417,730.
(Continued)

(51) Int. Cl.
*H01L 29/08* (2006.01)
*H01L 21/02* (2006.01)
(Continued)

(52) U.S. Cl.
CPC .... *H01L 29/0847* (2013.01); *H01L 21/02595* (2013.01); *H01L 21/02686* (2013.01);
(Continued)

(58) Field of Classification Search
CPC .......... H01L 29/0847; H01L 21/02595; H01L 21/02686; H01L 29/04; H01L 29/0684;
(Continued)

(56) References Cited

U.S. PATENT DOCUMENTS 5,554,870 A * 9/1996 Fitch ................... H10B 10/125
                                                        257/334
6,049,106 A    4/2000 Forbes
(Continued)

FOREIGN PATENT DOCUMENTS

EP        0901169           3/1999
KR    10-2002-0063093       8/2002
(Continued)

OTHER PUBLICATIONS

WO PCT/US2020/045103 IPRP, Feb. 8, 2022.
WO PCT/US2020/045103 Search Rep, Dec. 1, 2020.
WO PCT/US2020/045103 Writt Opin., Dec. 1, 2020.

*Primary Examiner* — Duy T Nguyen
(74) *Attorney, Agent, or Firm* — Wells St. John P.S.

(57) ABSTRACT

A transistor comprises a top source/drain region, a bottom source/drain region, a channel region vertically between the top and bottom source/drain regions, and a gate operatively laterally-adjacent the channel region. The channel region is crystalline and comprises a plurality of vertically-elongated crystal grains that individually are directly against both of the top source/drain region and the bottom source/drain region. Other embodiments, including methods, are disclosed.

7 Claims, 8 Drawing Sheets

Related U.S. Application Data

(60) Provisional application No. 62/884,781, filed on Aug. 9, 2019.

(51) Int. Cl.
    *H01L 29/04*         (2006.01)
    *H01L 29/06*         (2006.01)
    *H01L 29/66*         (2006.01)
    *H01L 29/78*         (2006.01)

(52) U.S. Cl.
    CPC .......... *H01L 29/04* (2013.01); *H01L 29/0684* (2013.01); *H01L 29/66666* (2013.01); *H01L 29/7827* (2013.01)

(58) Field of Classification Search
    CPC ........... H01L 29/66666; H01L 29/7827; H01L 29/78642; H01L 29/78648; H01L 29/78696; H01L 21/0245; H01L 21/02502; H01L 21/02513; H01L 21/02532
    USPC .......................................................... 257/64
    See application file for complete search history.

(56) References Cited

U.S. PATENT DOCUMENTS

| | | | |
|---|---|---|---|
| 6,362,511 B1 * | 3/2002 | Mizushima | H01L 21/823828 257/412 |
| 7,217,606 B2 | 5/2007 | Forbes et al. | |
| 8,034,671 B2 | 10/2011 | Peng et al. | |
| 8,053,776 B2 * | 11/2011 | Ohashi | H01L 27/102 257/65 |
| 9,613,805 B1 | 4/2017 | Schustereder et al. | |
| 10,373,956 B2 | 8/2019 | Gupta et al. | |
| 11,024,736 B2 | 6/2021 | Liu et al. | |
| 11,688,808 B2 | 6/2023 | Liu et al. | |
| 2001/0001745 A1 | 5/2001 | Im et al. | |
| 2002/0100909 A1 | 8/2002 | Yamaguchi et al. | |
| 2003/0102508 A1 * | 6/2003 | Lee | H01L 29/78696 257/E29.293 |
| 2003/0211666 A1 * | 11/2003 | Okumura | H01L 29/78621 257/288 |
| 2004/0085268 A1 | 5/2004 | Kim et al. | |
| 2004/0152269 A1 | 8/2004 | Hergenrother et al. | |
| 2004/0232480 A1 * | 11/2004 | Ohta | H01L 29/42392 257/E27.081 |
| 2005/0020096 A1 | 1/2005 | Miyairi et al. | |
| 2006/0141684 A1 | 6/2006 | Peng et al. | |
| 2009/0269892 A1 | 10/2009 | Hatano et al. | |
| 2010/0044702 A1 | 2/2010 | Urayama et al. | |
| 2011/0017990 A1 | 1/2011 | Son et al. | |
| 2011/0068418 A1 | 3/2011 | Lung | |
| 2012/0217500 A1 | 8/2012 | Park et al. | |
| 2013/0295737 A1 | 11/2013 | Tang et al. | |
| 2014/0255184 A1 | 8/2014 | Colinge et al. | |
| 2015/0044833 A1 | 2/2015 | Lee et al. | |
| 2015/0340631 A1 | 11/2015 | Rinzler et al. | |
| 2018/0277445 A1 | 9/2018 | Gluschenkov et al. | |
| 2019/0279913 A1 | 9/2019 | Gluschenkov et al. | |
| 2020/0066513 A1 | 2/2020 | Nahar et al. | |
| 2020/0303543 A1 | 9/2020 | Cheng et al. | |
| 2020/0312849 A1 | 10/2020 | Cheng | |
| 2020/0355601 A1 | 10/2020 | Liu et al. | |
| 2020/0395238 A1 | 12/2020 | Cheng et al. | |

FOREIGN PATENT DOCUMENTS

| | | |
|---|---|---|
| KR | 10-2003-0073076 | 9/2003 |
| KR | 10-2017-0074757 | 6/2017 |
| WO | WO 97/45827 | 12/1997 |

* cited by examiner

VERTICAL TRANSISTORS HAVING AT LEAST 50% GRAIN BOUNDARIES OFFSET BETWEEN TOP AND BOTTOM SOURCE/DRAIN REGIONS AND THE CHANNEL REGION THAT IS VERTICALLY THEREBETWEEN

RELATED PATENT DATA

This patent resulted from a divisional application of U.S. patent application Ser. No. 16/986,436, filed Aug. 6, 2020, entitled "Vertical Transistors With Channel Region Having Vertically Elongated Crystal Grains That Individually Are Directly Against Both Of The Top And Bottom Source/Drain Regions", naming Manuj Nahar, Vassil N. Antonov, Kamal M. Karda, Michael Mutch, Hung-Wei Liu, and Jeffery B. Hull as inventors, which is now U.S. Pat. No. 11,417,730, and which claims priority to U.S. Provisional Patent Application Ser. No. 62/884,781, filed Aug. 9, 2019, entitled "Transistor And Methods Of Forming Transistors", naming Manuj Nahar, Vassil N. Antonov, Kamal M. Karda, and Michael Mutch as inventors, the disclosures of which are incorporated by reference.

TECHNICAL FIELD

Embodiments disclosed herein pertain to transistors and to methods of forming transistors.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Field effect transistors are of course also used in integrated circuitry other than and/or outside of memory circuitry.

DETAILED DESCRIPTION OF EXAMPLE EMBODIMENTS

Figure 1:
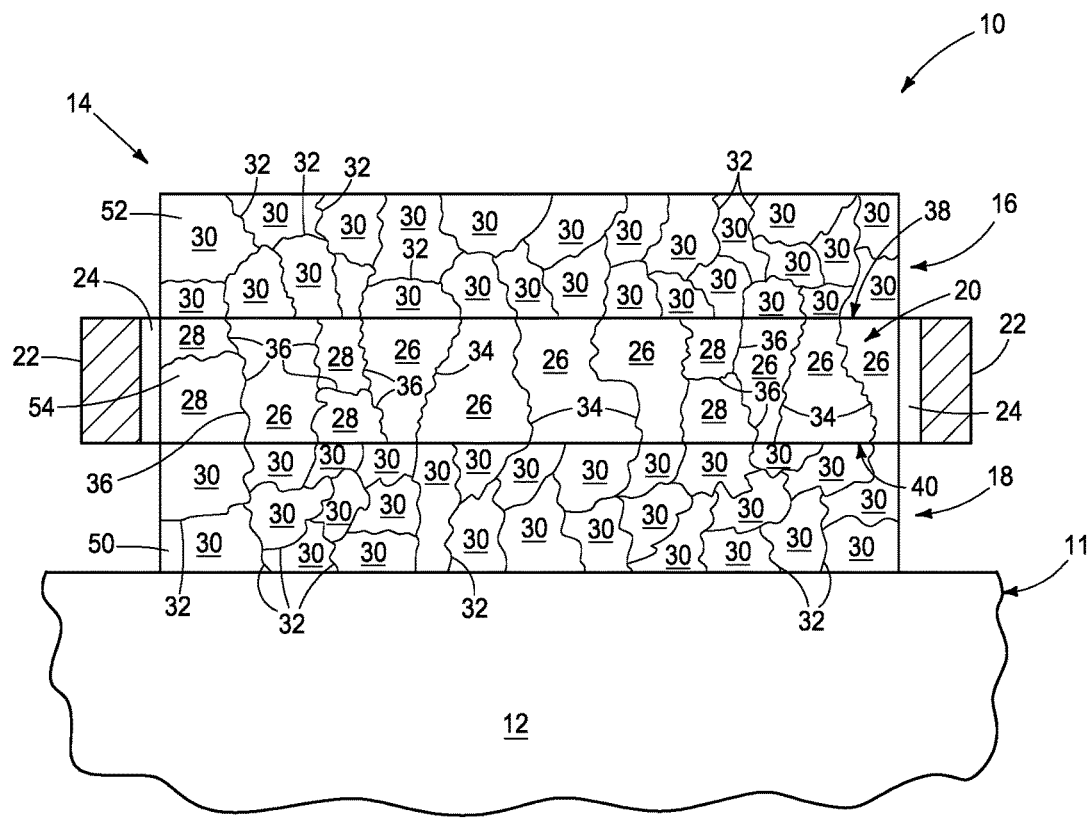
FIG. 1 is a diagrammatic sectional view of a transistor in accordance with an embodiment of the invention.

Embodiments of the invention encompass methods of forming one or more transistors and one or more transistors independent of method of manufacture. Transistors manufactured in accordance with method embodiments may have any of the attributes as described herein in structure embodiments. A first example transistor 14 in accordance with an embodiment of the invention as part of a construction 10 is shown in FIG. 1. Construction 10 comprises a base substrate 11 having any one or more of conductive/conductor/conducting, semiconductive/semiconductor/semiconducting, or insulative/insulator/insulating (i.e., electrically herein) material(s) 12. Various materials have been formed elevationally over base substrate 11. Materials may be aside, elevationally inward, or elevationally outward of the FIG. 1—depicted materials. For example, other partially or wholly fabricated components of integrated circuitry may be provided somewhere above, about, or within base substrate 11. Only one transistor 14 is shown, although construction 10 may comprise multiple of the same or different construction transistors, for example fabricated in an array which includes one or more transistors in accordance with the invention.

Transistor 14 comprises a top source/drain region 16, a bottom source/drain region 18, a channel region 20 vertically between top and bottom source/drain regions 16, 18, respectively, and a gate 22 (i.e., conductive material) operatively laterally-adjacent channel region 20. A gate insulator 24 (e.g., silicon dioxide and/or silicon nitride) is between gate 22 and channel region 20. The example depicted components for brevity and clarity are only shown in FIG. 1 as a vertical cross-section. The example source/drain regions and channel regions may be, for example, in the form of coextensive longitudinally elongated lines running into and out of the plane of the page upon which FIG. 1 lies. Alternately and by way of example only, such may be circular, rectangular, elliptical, triangular, etc. in horizontal cross-section (not shown). Gate insulator 24 and/or gate 22 may peripherally encircle such structures or alternately, by way of example only, be only partially around such structures or only on one lateral-side in vertical cross-section (not shown). Top source/drain region 16 and channel region 20 may be considered as having a top interface 38 and bottom source/drain region 18 and channel region 20 may be considered as having a bottom interface 40. Interfaces 38 and/or 40 are shown as being flat and horizontal, although other oriented interfaces may be used, for example diagonal, a jagged and/or undulating interface, a combination of straight and curved segments, etc. By way of examples only, regions 16, 18, and 20 may comprise one or more of elemental-form silicon, elemental-form germanium, a mixture of silicon and germanium, etc.

In one embodiment, top source/drain region 16 and bottom source/drain region 18 are each crystalline. In this document, "crystalline" not immediately preceded by a numerical percentage or other quantifying adjective is a material, region, and/or structure that is at least 90% by volume crystalline (i.e., having at least 90% by volume crystal grains). Channel region 20 is crystalline and comprises a plurality of vertically-elongated crystal grains 26 that individually are directly against both of top source/drain region 16 and bottom source/drain region 18. A channel region having a plurality of vertically-elongated crystal grains that individually are directly against both of the top and bottom source/drain regions may exhibit greater current flow between the top and bottom source/drain regions than a channel region not having such vertically-elongated crystal grains. In one embodiment, less than all crystal grains that are in channel region 20 are directly against both of top source/drain region 16 and bottom source/drain region 18, with example channel region 20 having example alternate crystal grains 28. In one embodiment, at least 10%, in one such embodiment at least 50% and in one such embodiment at least 90%, of all crystal grains that are in channel region 20 are directly against both of top source/drain region 16 and bottom source/drain region 18. In one embodiment, channel region 20 is polycrystalline.

Figure 2:
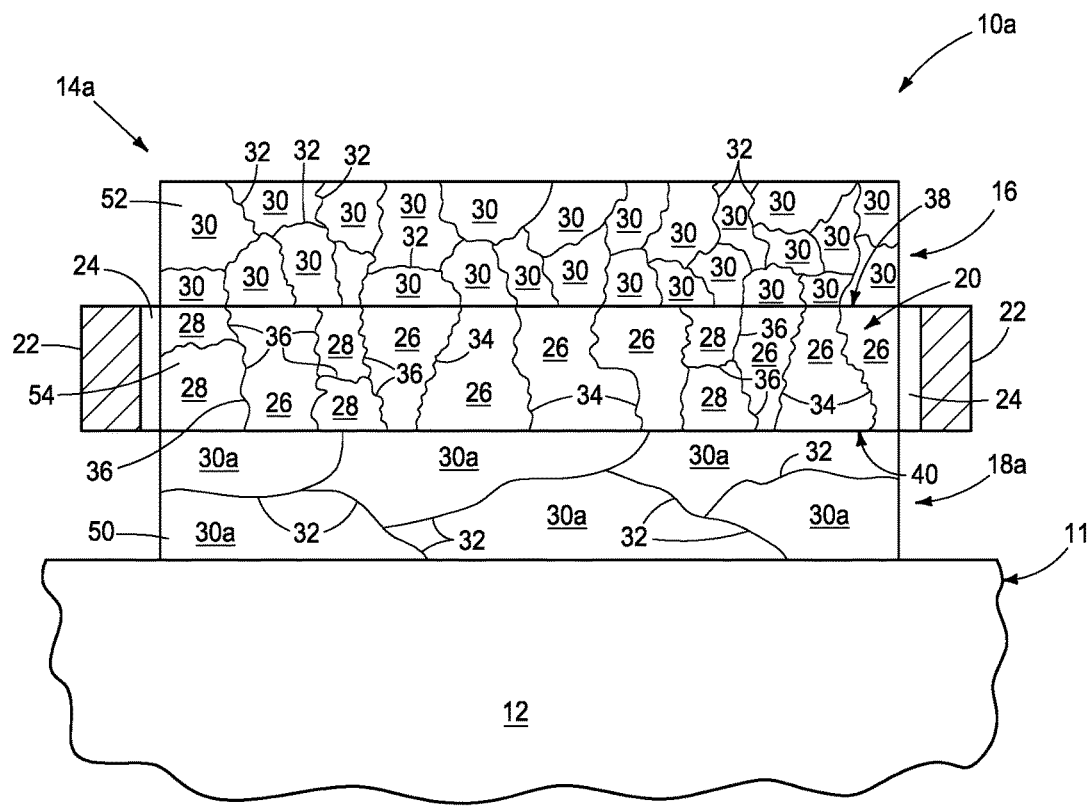
FIG. 2 is a diagrammatic sectional view of a transistor in accordance with an embodiment of the invention.

In one embodiment, top source/drain region 16, bottom source/drain region 18, and channel region 20 individually have an average crystal grain size (i.e., volumetric), with the average crystal grain size of channel region 20 being different from the average crystal grain size of at least one of top source/drain region 16 and bottom source/drain region 18. FIG. 1 shows an example wherein the average crystal grain size of channel region 20 is greater than that of at least one, in one embodiment both as shown, of top source/drain region 16 and bottom source/drain region 18. FIG. 2 shows an example alternate transistor 14a of a construction 10a wherein the average crystal grain size of channel region 20 is greater than only one (e.g., top source/drain region 16) of top source/drain region 16 and bottom source/drain region 18a (e.g., as example crystal grains 30a in bottom source/drain region 18a are larger). Like numerals from the above-described embodiments have been used where appropriate, with some construction differences being indicated with the suffix "a". Any other attribute(s) or aspect(s) as shown and/or described herein with respect to other embodiments may be used. Greater crystal grain size in a channel region may provide greater current flow in comparison to channel regions having smaller crystal grain size. Further, providing a transistor having a channel region with average crystal grain size different from that of at least one of the top and bottom source/drain regions may enable tailoring of certain operational characteristics (e.g., current magnitude and/or otherwise) of the transistor than may otherwise occur if they had the same average crystal grain size.

In some embodiments, top and bottom source/drain regions 16 and 18, respectively, comprise polycrystalline crystal grains 30 and grain boundaries 32 between immediately-adjacent polycrystalline crystal grains 30. Vertically-elongated crystal grains 26 may be considered as comprising grain boundaries 34 between immediately-adjacent vertically-elongated crystal grains 26 and grain boundaries 36 that are not between immediately-adjacent vertically-elongated crystal grains 26 (e.g., that are between immediately-adjacent grains 28 and that are between immediately-adjacent grains 26 and 28). In one embodiment, at least 30%, in one embodiment at least 60%, of grain boundaries 32 in top source/drain region 16 at top interface 38 align with grain boundaries 34 of vertically-elongated crystal grains 26 in channel region 20 at top interface 38. In one embodiment, at least 30%, in one embodiment at least 60%, of grain boundaries 32 in bottom source/drain region 18 at bottom interface 40 align with grain boundaries 34 of vertically-elongated crystal grains 26 in channel region 20 at bottom interface 40. Greater-quantity alignment of such grain boundaries at such interfaces may result in greater current flow than occurs in comparison to lesser-quantity alignment of such grain boundaries at such interfaces. Further, greater-quantity alignment of such grain boundaries at such interfaces may enable tailoring of certain operational characteristics of the transistor (e.g., current magnitude and/or otherwise) than may otherwise occur/exist in comparison to lesser-quantity alignment of such grain boundaries at such interfaces.

In one embodiment, a transistor (e.g., 14) comprises a top source/drain region (e.g., 16), a bottom source/drain region (e.g., 18), and a channel region (e.g., 20) vertically between the top and bottom source/drain regions, and a gate (e.g., 22) operatively laterally-adjacent the channel region. The top source/drain region, the bottom source/drain region, and the channel region are crystalline and individually have an average crystal grain size. The average crystal grain size of the channel region is different from the average crystal grain size of at least one of the top source/drain region and the bottom source/drain region (e.g., regardless of whether the channel region comprises a plurality of vertically-elongated crystal grains that individually are directly against both of the top source/drain region and bottom source/drain region). Again, larger crystal grain size in a channel region may provide greater current flow in comparison to channel regions having smaller crystal grain size. Further, providing a transistor having a channel region with average crystal grain size different from that of at least one of the top and bottom source/drain regions may enable tailoring of certain operational characteristics (e.g., current magnitude and/or otherwise) of the transistor than may otherwise occur if they had the same average crystal grain size. Any other attribute(s) or aspect(s) as shown and/or described herein with respect to other embodiments may be used.

Figure 3:
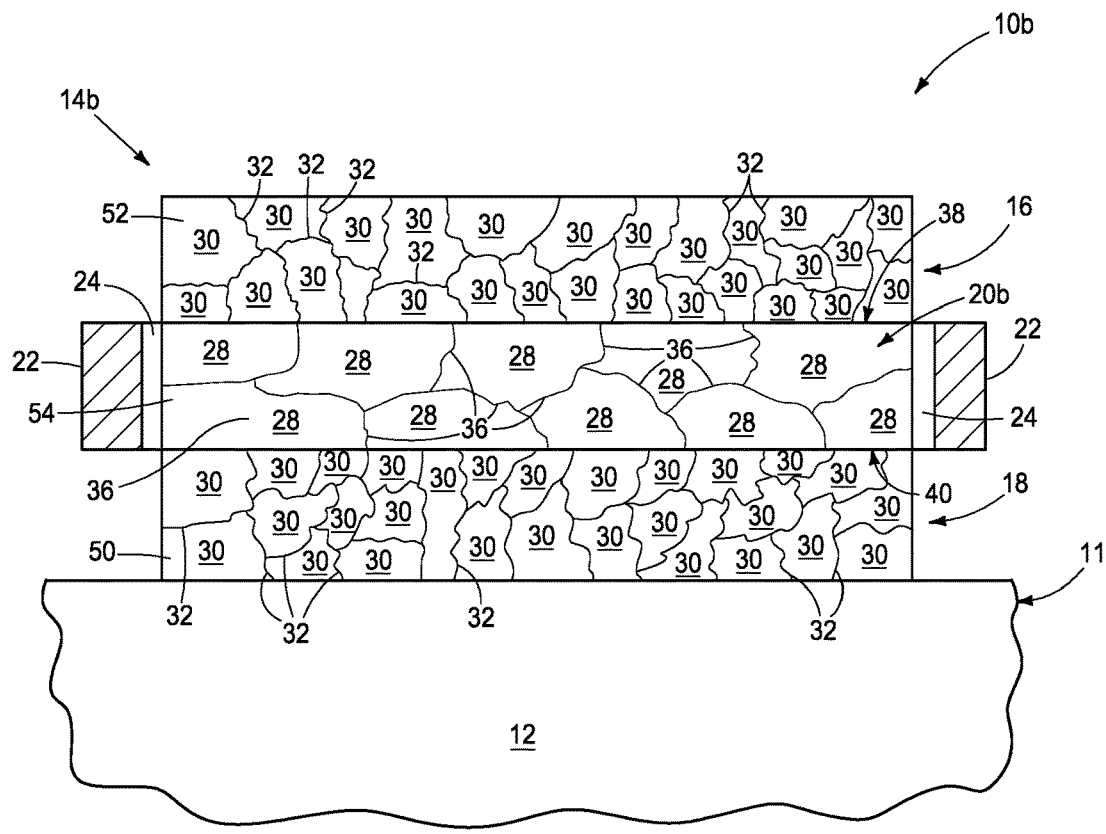
FIG. 3 is a diagrammatic sectional view of a transistor in accordance with an embodiment of the invention.
Figure 4:
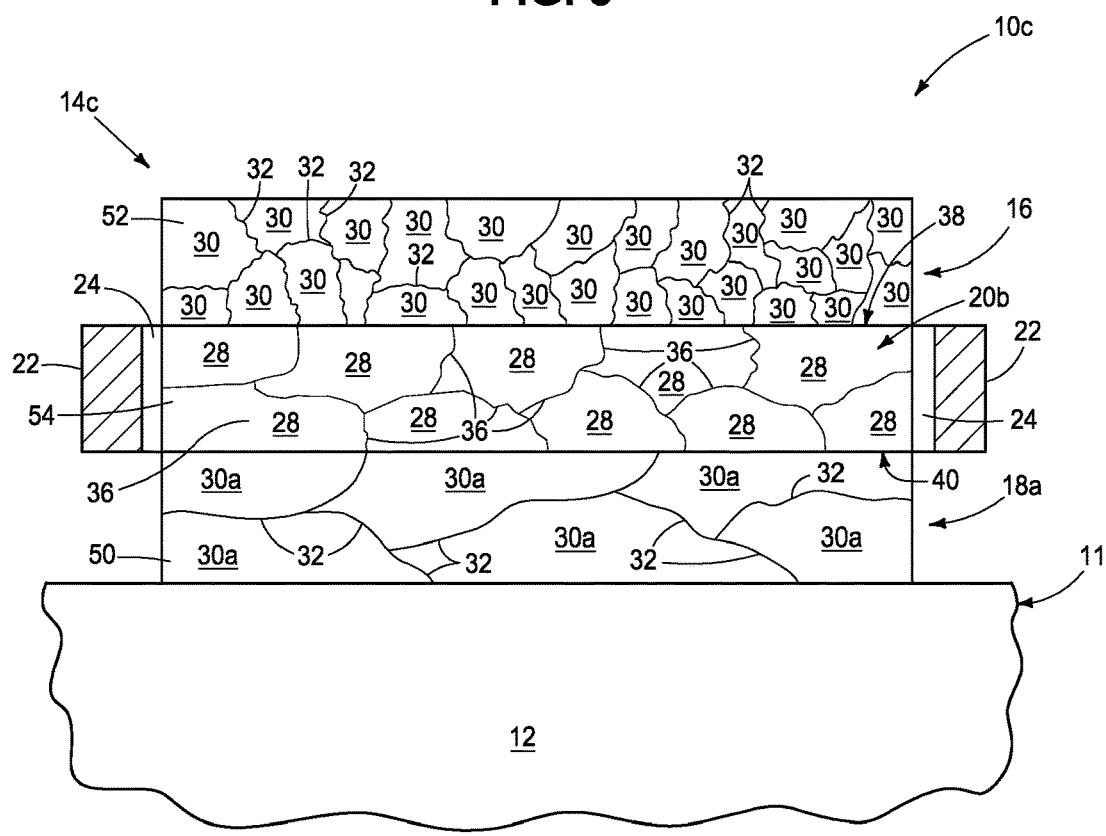
FIG. 4 is a diagrammatic sectional view of a transistor in accordance with an embodiment of the invention.

FIGS. 3 and 4 show alternate embodiment transistors 14b and 14c, respectively, of constructions 10b and 10c, respectively. Like numerals from the above-described embodiments have been used where appropriate, with some construction differences being indicated with the suffix "b" or the suffix "c". Example channel region 20b of transistors 14b and 14c has no vertically-elongated crystal grains that individually are directly against both of the top source/drain region and bottom source/drain region. Any other attribute(s) or aspect(s) as shown and/or described herein with respect to other embodiments may be used.

In one embodiment, the average crystal grain size of the channel region (e.g., 20, 20b) is greater than that of at least one of the top source/drain region and the bottom source/drain region (e.g., transistors 14, 14a, 14b, 14c), in one embodiment is greater than both of the top source/drain region and the bottom source/drain region (e.g., transistors 14, 14b), and in another embodiment is greater than only one of the top source/drain region and the bottom source/drain region (e.g., transistors 14a, 14c). In one embodiment, the average crystal grain size of the top source/drain region and the bottom source/drain region are the same (e.g., transistors 14, 14b). Any other attribute(s) or aspect(s) as shown and/or described herein with respect to other embodiments may be used.

Figure 5:
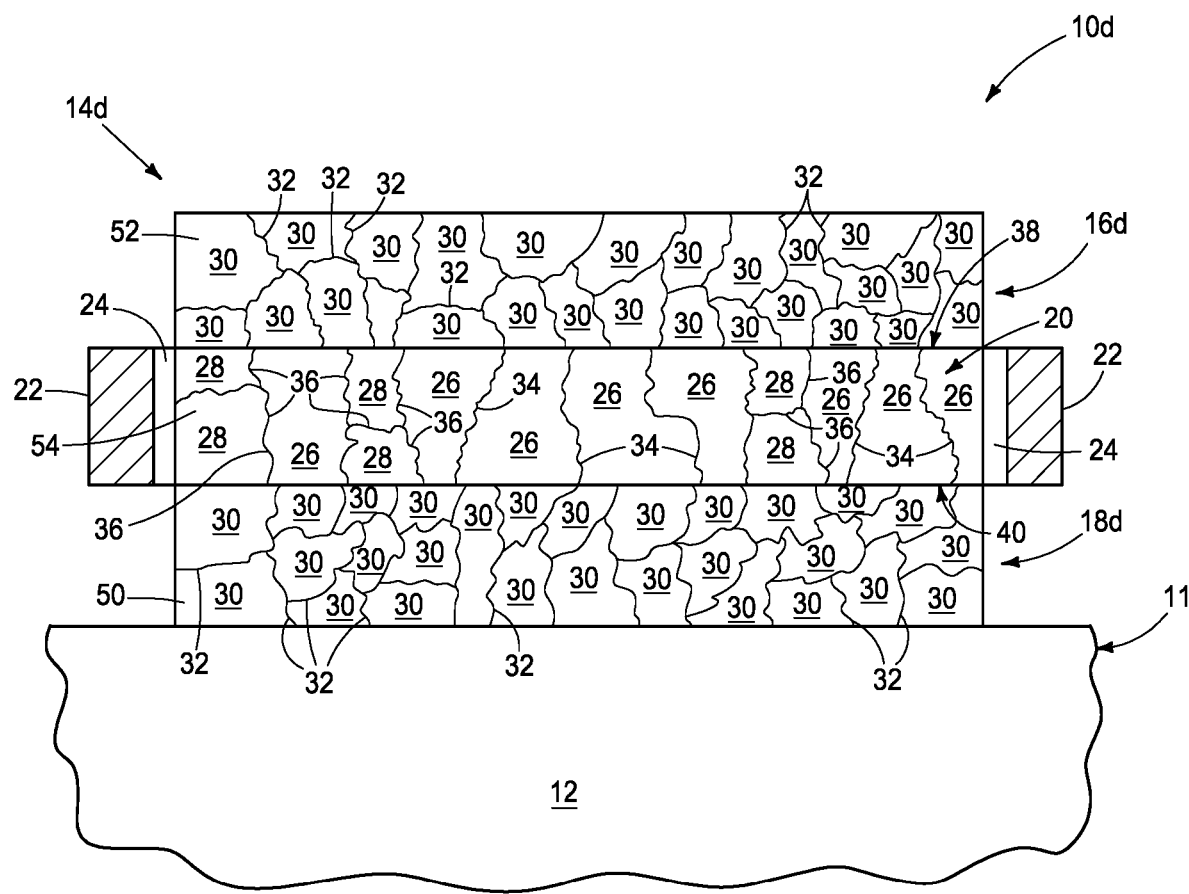
FIG. 5 is a diagrammatic sectional view of a transistor in accordance with an embodiment of the invention.

FIG. 5 shows an example alternate transistor 14d of a construction 10d having a top source/drain region 16d and a bottom source/drain region 18d. Like numerals from the above-described embodiments have been used where appropriate, with some construction differences being indicated with the suffix "d". In one embodiment, a transistor (e.g., 14d) comprises a top source/drain region (e.g., 16d), a bottom source/drain region (e.g., 18d), a channel region (e.g., 20) vertically between the top and bottom source/drain regions, and a gate (e.g., 22) operatively laterally-adjacent the channel region. The top and bottom source/drain regions have polycrystalline crystal grains (e.g., 30) and grain boundaries (e.g., 32) between immediately-adjacent of the polycrystalline crystal grains. The channel region has channel crystal grains (e.g., 26, 28) comprising grain boundaries (e.g., 34, 36) between immediately-adjacent of the channel crystal grains. The top source/drain region and the channel region have a top interface (e.g., 38) and the bottom source/drain region and the channel region have a bottom interface (e.g., 40). At least 50%, in one embodiment at least 75%, in one embodiment at least 85%, of the grain boundaries in the top source/drain region at the top interface are laterally offset from the grain boundaries of the channel crystal grains in the channel region at the top interface (e.g., regardless of whether the channel region comprises a plurality of vertically-elongated crystal grains that individually are directly against both of the top source/drain region and bottom source/drain region). At least 50%, in one embodiment at least 75%, in one embodiment at least 85%, of the grain boundaries in the bottom source/drain region at the bottom interface are laterally offset from the grain boundaries of the channel crystal grains in the channel region at the bottom interface (e.g., regardless of whether the channel region comprises a plurality of vertically-elongated crystal grains that individually are directly against both of the top source/drain region and bottom source/drain region). In one embodiment, a plurality of the channel grain boundaries are vertically-elongated crystal grains (e.g., 26) that individually are directly against both of the top source/drain region and the bottom source/drain region. Lateral offset of grain boundaries can reduce tendency of conductivity-modifying dopant to diffuse between the channel region and an immediately-adjacent source/drain region. Any other attribute(s) or aspect(s) as shown and/or described herein with respect to other embodiments may be used.

Embodiments of the invention comprise methods of forming a transistor (e.g., 14, 14a, 14b, 14d). Transistors formed in accordance with method embodiments may have any of the attributes described above with respect to structure embodiments. Structure embodiments of transistors may have any of the attributes described below with respect to method embodiments. In one method embodiment, such includes forming a bottom material (e.g., 50), a top material (e.g., 52), and a middle material (e.g., 54) between the bottom and top materials. The bottom, top, and middle materials respectively comprise a bottom source/drain region (e.g., 18, 18a, 18d), a top source/drain region (e.g., 16, 16d), and a channel region (e.g., 20, 20b) vertically between the bottom and top source/drain regions in a finished construction of the transistor. At least the bottom and the top materials comprise conductivity-increasing dopant therein in the finished construction of the transistor (e.g., ideally at a concentration sufficient to render such to be conductive in the finished construction of the transistor, for example to have some region thereof having a maximum dopant concentration of at least $10^{19}$ atoms/cm$^3$). At least two of the bottom, top, and middle materials are annealed together to crystallize the at least two of the bottom, top, and middle materials to be crystalline. The annealing may form any of the bottom, top, and middle materials to have any of the crystalline structures of FIGS. 1-5. A gate insulator (e.g., 24) and a gate (e.g., 22) are formed laterally-adjacent the middle material, for example to form any of the constructions of FIGS. 1-5. In one embodiment, the method comprises conducting the annealing before forming the gate. In one embodiment, the annealing activates conductivity-increasing dopant that is in at least one of the at least one of the bottom, top, and middle materials.

In one embodiment, the at least two of the bottom, top, and middle materials are amorphous immediately prior to the annealing. In this document, a material, region, and/or structure is "amorphous" if such is at least 90% by volume amorphous. Alternately as examples, the at least two of the bottom, top, and middle materials may be crystalline immediately prior to the annealing (e.g., of one 3D crystal lattice that is transformed by the annealing to a different 3D crystal lattice) or be neither amorphous nor crystalline as defined herein (e.g., have crystal grains therein from greater than 10% by volume to below 90% by volume). In one embodiment, the method comprises annealing only two of the bottom, top, and middle materials together, in one such embodiment annealing the bottom and middle materials together and in another such embodiment annealing the middle and top materials together.

In one embodiment, the annealing comprises laser annealing. By way of examples only, laser annealing may use a wavelength between 200 and 700 nanometers, power at 0.1 to 2 J/cm$^2$ (ideally, 0.5 to 2 J/cm$^2$), pulse width 5 to 250 nanoseconds, number of laser shots 1 to 100, and substrate temperature from room temperature to 450° C. Laser power for all anneals herein can be varied as selected by the artisan to control surface roughness of interfaces and grain size of the layer(s) being laser annealed. Additionally, substrate temperature may be varied for different laser shots, as may laser power and/or pulse width. In one embodiment, at least one of the at least two time-spaced laser annealing steps uses only 1 laser shot. In another embodiment, at least one of the at least two time-spaced laser annealing steps uses more than one 1 laser shot, and in one such embodiment uses no more than 1,000 laser shots. Alternately, more than 1,000 laser shots may be used. In one embodiment, at least one of the at least two time-spaced laser annealing steps uses multiple laser shots and an earlier plurality of the multiple laser shots forms crystal grains. A later plurality of the multiple laser shots after the earlier plurality increases average crystal grain size of the crystal grains formed during the earlier plurality.

Alternately by way of examples, the annealing may comprise thermal annealing or microwave annealing. Example thermal annealing conditions include substrate temperature of 450° C. to 1,000° C., an inert ambient (e.g., $N_2$, noble gas, etc.), pressure from 1 mTorr to atmospheric pressure, and time from 1 second to 12 hours. Example microwave annealing conditions include microwave power from 500 to 10,000 Watts, substrate temperature at room temperature, an inert ambient (e.g., $N_2$, noble gas, etc.), pressure from 1 mTorr to atmospheric pressure, and time from 1 second to 12 hours. The annealing may comprise any two or more of the above example annealing methods, including of any other existing or future-developed annealing methods.

Any other attribute(s) or aspect(s) as shown and/or described herein with respect to other embodiments may be used.

Figure 6:
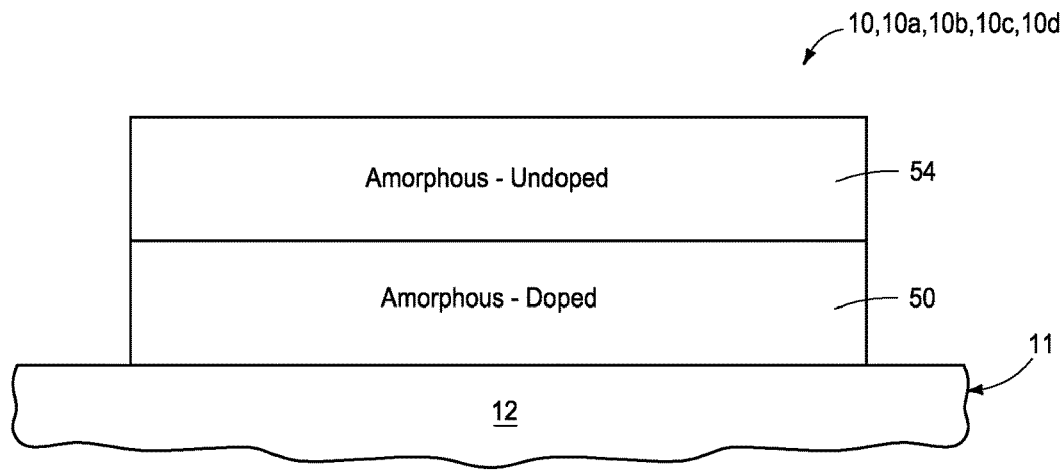
FIG. 6 is a diagrammatic cross-sectional view of a portion of a substrate construction in process in accordance with an embodiment of the invention.

In one embodiment, a method of forming a transistor (e.g., 14, 14a, 14b, 14d) comprises forming a bottom material (e.g., 50), a top material (e.g., 52), and a middle material (e.g., 54) between the bottom and top materials. The bottom, top, and middle materials respectively comprise a bottom source/drain region (e.g., 18, 18a, 18d), a top source/drain region (e.g., 16, 16d), and a channel region (e.g., 20, 20b) vertically between the bottom and top source/drain regions in a finished construction of the transistor. This example embodiment is further described with reference to FIGS. 6-8. Referring to FIG. 6, such shows a predecessor construction to any of constructions 10, 10a, 10b, 10c, and 10d described above. Like numerals have been used where appropriate for predecessor constructions. Bottom material 50 (e.g., one or more of elemental-form silicon, elemental-form germanium, a mixture of silicon and germanium, etc.) has been formed to be amorphous and have conductivity-increasing dopant therein (e.g., at a concentration that will render bottom material 50 conductive in the finished construction of the transistor). Middle material 54 (e.g., one or more of elemental-form silicon, elemental-form germanium, a mixture of silicon and germanium, etc.) has been formed to be amorphous and in one embodiment to at least initially be undoped. In this document, "undoped" means from zero percent up to no greater than 0.1 molar percent of any and all conductivity-modifying dopant (e.g., phosphorus, arsenic, etc.), with "doped" meaning more than 0.1 molar percent of any and all conductivity-modifying dopant. For convenience and ease of illustration only, materials 50 and 54 are shown essentially as being patterned into a final shape of the transistor being formed although such may not have occurred at this point of processing.

Figure 7:
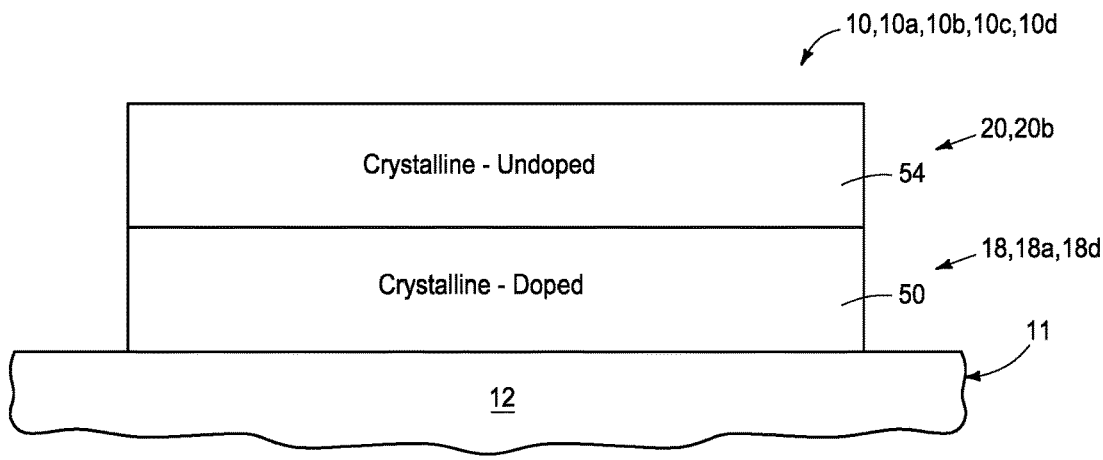
FIGS. 7 and 8 are diagrammatic sequential cross-sectional views of the construction of FIG. 6 in process in accordance with an embodiment of the invention.

Referring to FIG. 7, the amorphous bottom and middle materials have been annealed together to crystallize bottom material 50 and middle material 54 to be crystalline. In one embodiment, the annealing activates the conductivity-increasing dopant that is in bottom material 50. Such annealing may also activate dopant that may be in, if any is in, middle material 54. In one embodiment, the annealing comprises laser annealing although one or more other annealing techniques may be used, including laser annealing combined with one or more other annealing techniques.

Figure 8:
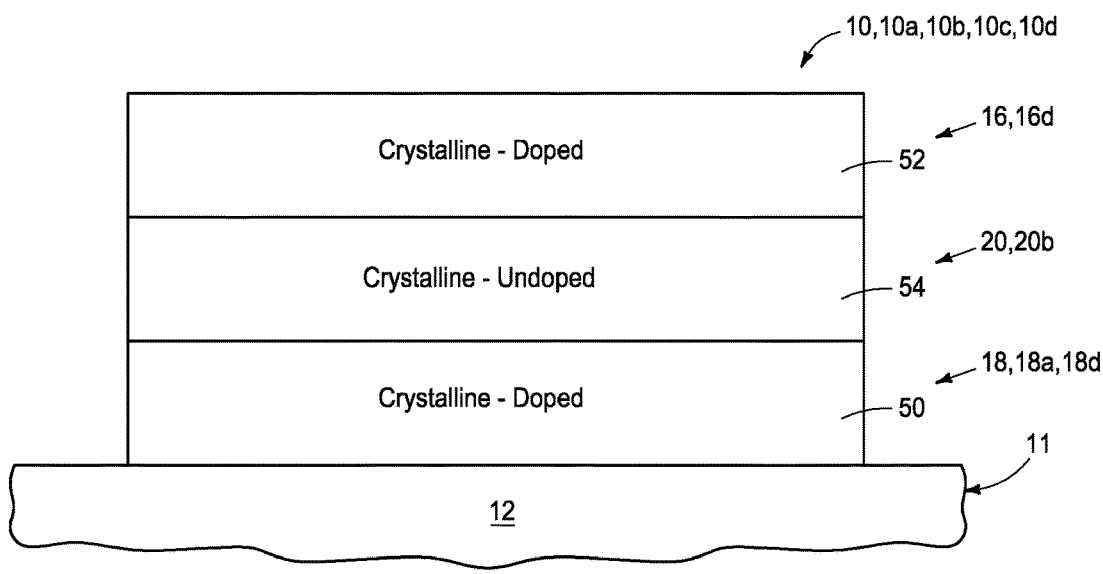

Referring to FIG. 8, top material 52 has been formed after annealing bottom material 50 and middle material 54 together. In one such embodiment, top material 52 is formed by epitaxial growth from an uppermost surface of crystalline middle material 54, and in one such latter embodiment is doped, and such conductivity-increasing dopant therein is activated, during such epitaxial growth. In the context of this document, a material or region that is "doped" comprises a conductivity-modifying dopant at a concentration of at least $1 \times 10^{14}$ atoms/cm$^3$. In another such embodiment, top material 52 is formed by a technique other than by epitaxial growth, and in one such latter embodiment is amorphous and is subsequentially annealed (e.g., by laser and/or other annealing). The uppermost surface of middle material 54 may be polished (e.g., by CMP) and/or a native oxide otherwise removed therefrom (e.g., by exposure to HF) prior to forming top material 52. The annealing may form any of the bottom, top, and middle materials to have any of the crystalline structures of FIGS. 1-5. A gate insulator and a gate are ultimately formed laterally-adjacent the middle material (e.g., before or after any annealing(s) described above), for example to form any of the constructions of FIGS. 1-5. Any other attribute(s) or aspect(s) as shown and/or described herein with respect to other embodiments may be used.

In one embodiment, a method of forming a transistor (e.g., 14, 14a, 14b, 14d) comprises forming a bottom material (e.g., 50), a top material (e.g., 52), and a middle material (e.g., 54) between the bottom and top materials. The bottom, top, and middle materials respectively comprise a bottom source/drain region (e.g., 18, 18a, 18d), a top source/drain region (e.g., 16, 16d), and a channel region (e.g., 20, 20b) vertically between the bottom and top source/drain regions in a finished construction of the transistor. At least the bottom material and the top material comprise conductivity-increasing dopant therein in the finished construction of the transistor (e.g., ideally at a concentration sufficient to render such to be conductive in the finished construction of the transistor). In at least two time-spaced laser annealing steps, laser annealing is conducted of at least two of the bottom, top, and middle materials (separately or together) to melt and then crystallize such at least two of the bottom, top, and middle materials to be crystalline. At least one of the laser annealing steps activates the conductivity-increasing dopant that is in at least one of the at least two of the bottom, top, and middle materials. The annealing may form any of the bottom, top, and middle materials to have any of the crystalline structures of FIGS. 1-5. A gate insulator (e.g., 24) and a gate (e.g., 22) are formed laterally-adjacent the middle material (e.g., before or after any annealing(s), for example to form any of the constructions of FIGS. 1-5. Any other attribute(s) or aspect(s) as shown and/or described herein with respect to other embodiments may be used.

Figure 9:
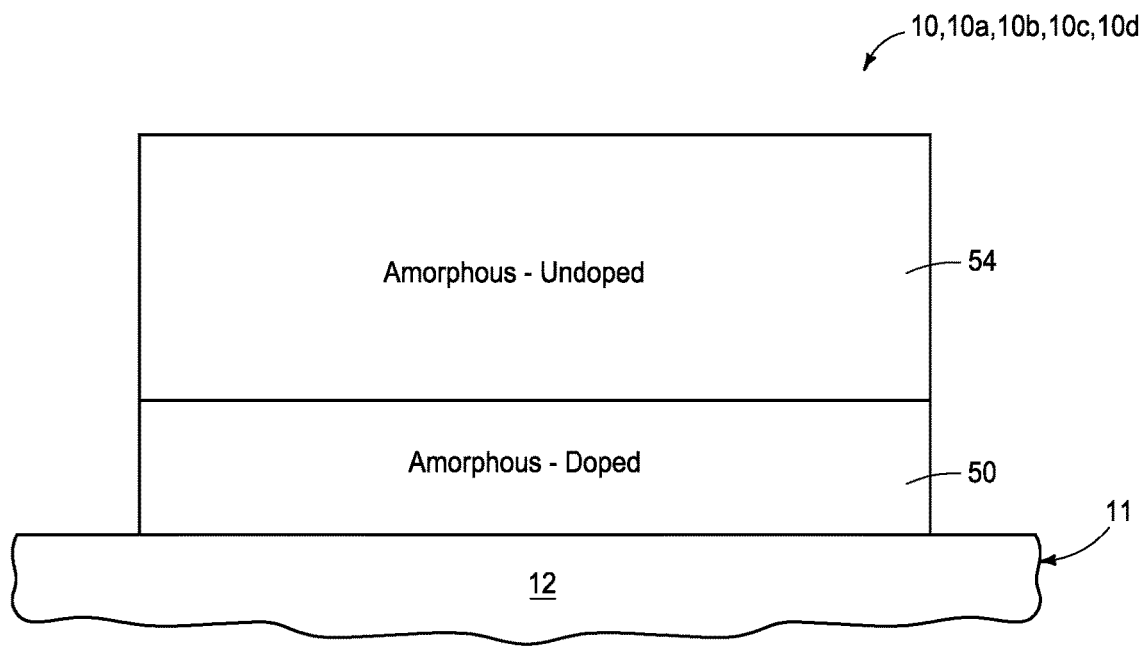
FIG. 9 is a diagrammatic cross-sectional view of a portion of a substrate construction in process in accordance with an embodiment of the invention.

One such embodiment is described with reference to FIGS. 9-12. Referring to FIG. 9, such shows a predecessor construction to any of constructions 10, 10a, 10b, 10c, and 10d described above. Again, like numerals have been used where appropriate for predecessor constructions. In one embodiment, bottom material 50 has been formed to be amorphous and have conductivity-increasing dopant therein (e.g., at a concentration that will render bottom material 50 conductive in the finished construction of the transistor). Middle material 54 has been formed to be amorphous. In one embodiment, such may be formed to at least initially be undoped.

Figure 10:
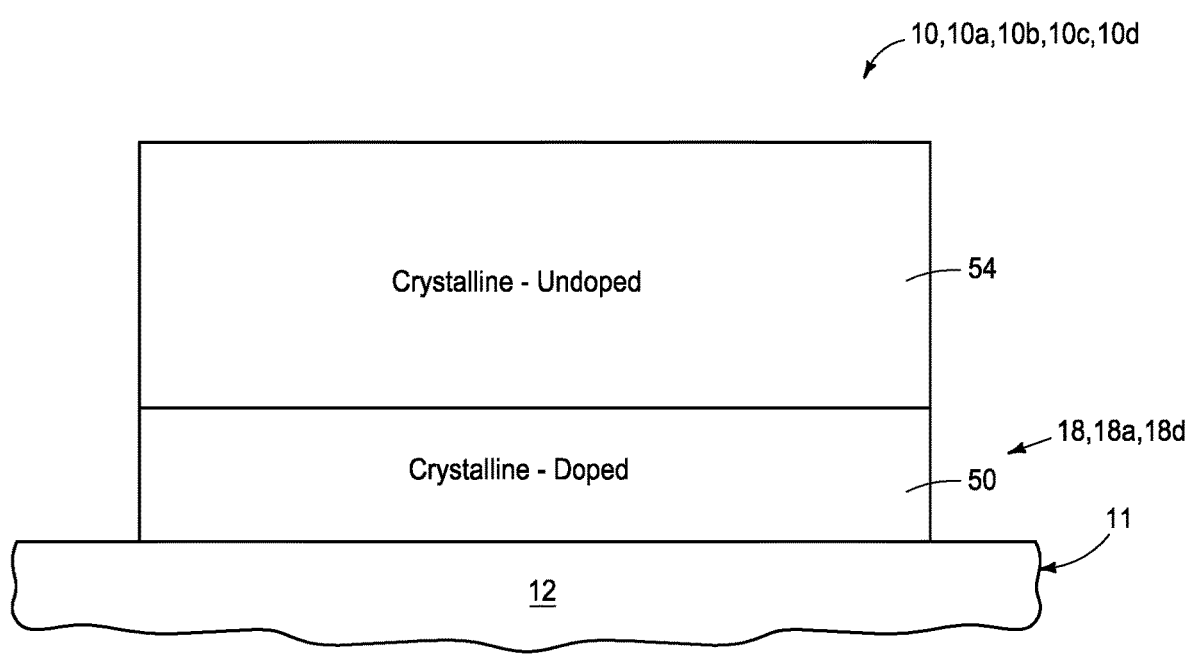
FIGS. 10-12 are diagrammatic sequential cross-sectional views of the construction of FIG. 9 in process in accordance with an embodiment of the invention.

Referring to FIG. 10, amorphous bottom material 50 and amorphous middle material 54 have been annealed together to melt and then crystallize the amorphous bottom and middle materials to be crystalline. In one embodiment, such annealing comprises laser annealing.

Figure 11:
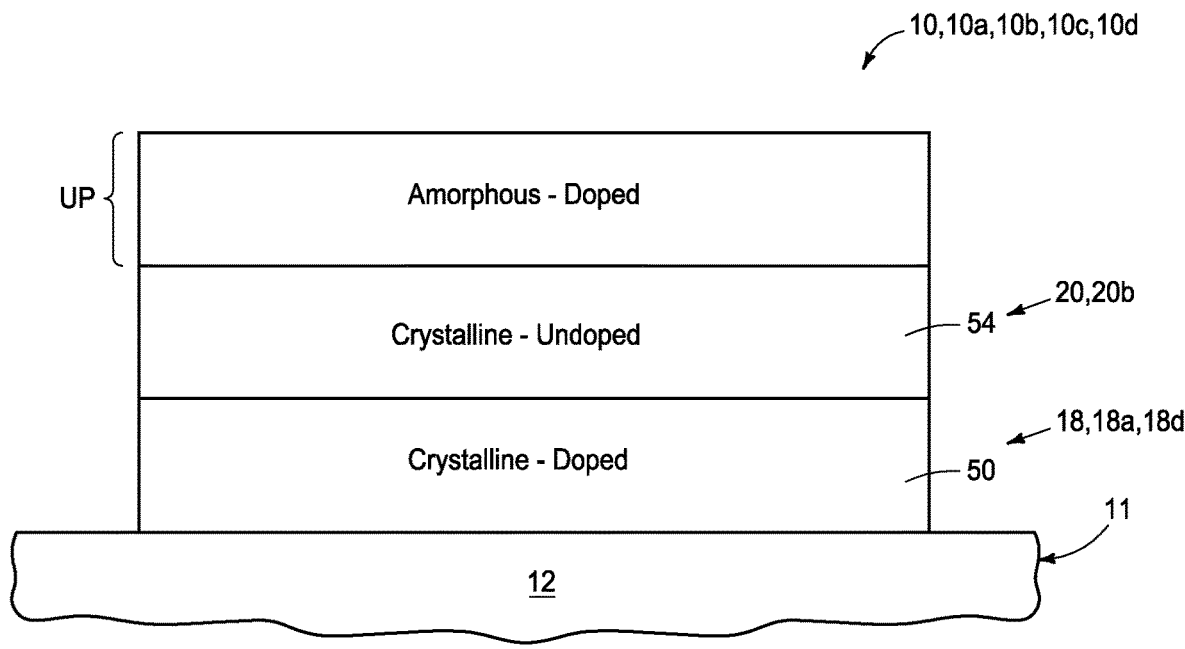

Referring to FIG. 11, conductivity-increasing dopant has been ion implanted into an uppermost portion UP of middle material 54 (e.g., a portion that will become top material 52) to render such uppermost portion to be amorphous. Ideally, the conductivity-increasing is implanted to a concentration sufficient to render such to be conductive in the finished construction of the transistor.

Figure 12:
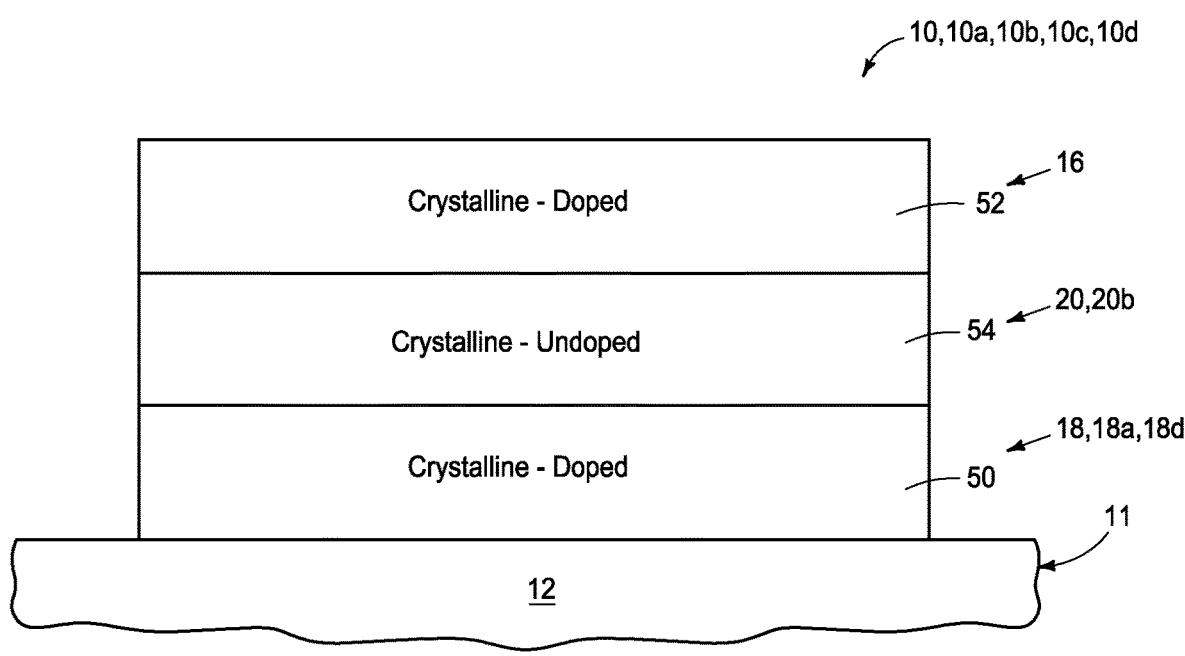
Figure 13:
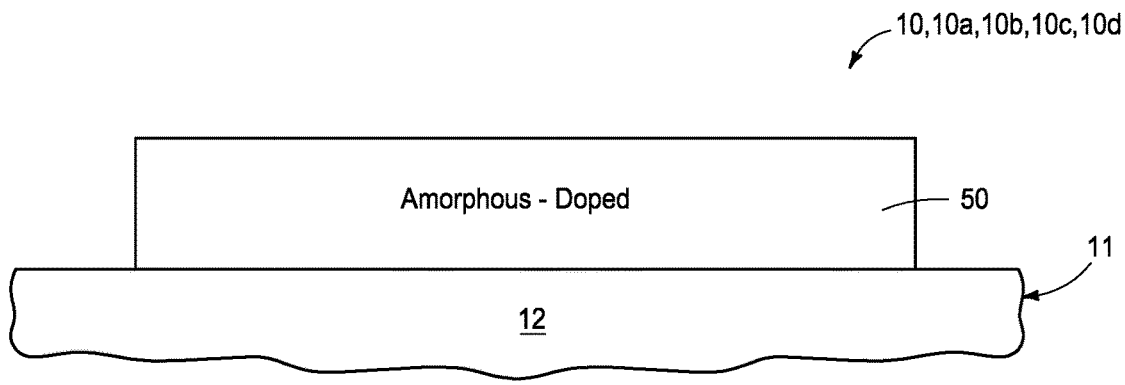
FIG. 13 is a diagrammatic cross-sectional view of a portion of a substrate construction in process in accordance with an embodiment of the invention.

Referring to FIG. 12, the uppermost portion has been annealed to crystallize it to be crystalline, activate the conductivity-increasing dopant therein, and form therefrom top source/drain region 16. Ideally, the annealing comprises laser annealing although one or more other annealing techniques may be used, including laser annealing combined with one or more other annealing techniques.

Any other attribute(s) or aspect(s) as shown and/or described herein with respect to other embodiments may be used.

In another alternate such embodiment, such a method comprises using three time-spaced laser annealing steps to separately melt and then crystallize the bottom material, the top material, and the middle material, with the three time-spaced laser annealing steps individually activating any and all of the conductivity-increasing dopant that is in the respective bottom, top, and middle material. In one embodiment, the method comprises using only two time-spaced laser annealing steps to melt and then crystallize the bottom material, the top material, and the middle material. In one such embodiment, one of the only two time-spaced laser annealing steps is used to melt and then crystallize each of the middle and bottom materials and in one embodiment one of the only two-spaced laser annealing steps is used to melt and then crystallize each of the top and middle materials. In one embodiment, each of the bottom, top, and middle materials is formed to be amorphous immediately prior to any annealing thereof.

In one embodiment, the middle material is formed to be crystalline before forming the top material, with the forming of the top material comprising forming the top material to be amorphous followed by annealing the amorphous top material to crystallize it and activate the conductivity-increasing dopant therein. In one embodiment, the method comprises forming at least one of the bottom, top, and middle materials to be from 25% crystalline to less than 90% crystalline by volume as initially formed, followed by annealing the initially-formed at least one material to be at least 90% crystalline by volume. In one embodiment, the at least two time-spaced laser annealing steps are conducted before forming the gate. In one embodiment, each of the bottom, top, and middle materials comprises at least one of elemental-form silicon, elemental-form germanium, or a mixture of silicon and germanium.

Any other attribute(s) or aspect(s) as shown and/or described herein with respect to other embodiments may be used.

Another such embodiment using at least two time-spaced annealing steps is described with reference to FIGS. 13-18. Referring to FIG. 13, such again shows a predecessor construction to any of constructions 10, 10a, 10b, 10c, and 10d described above. Like numerals have been used where appropriate for predecessor constructions. Bottom material 50 has been formed to be amorphous. In one ideal embodiment, bottom material 50 as initially formed has conductivity-increasing dopant therein at a concentration sufficient to render such to be conductive in the finished construction of the transistor.

Figure 14:
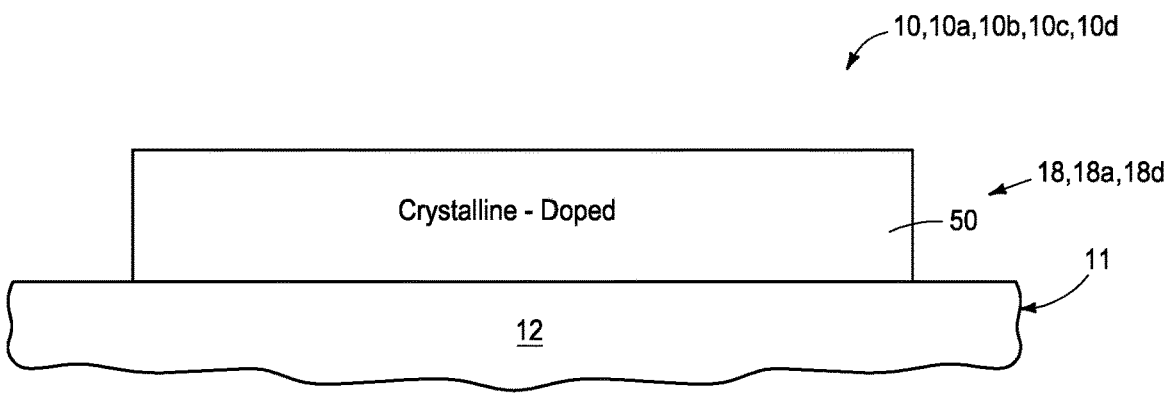
FIGS. 14-18 are diagrammatic sequential cross-sectional views of the construction of FIG. 13 in process in accordance with an embodiment of the invention.

Referring to FIG. 14, amorphous bottom material 50 has been annealed to melt and then crystallize amorphous bottom material 50 to be crystalline. Ideally, the annealing comprises laser annealing although one or more other annealing techniques may be used, including laser annealing combined with one or more other annealing techniques.

Figure 15:
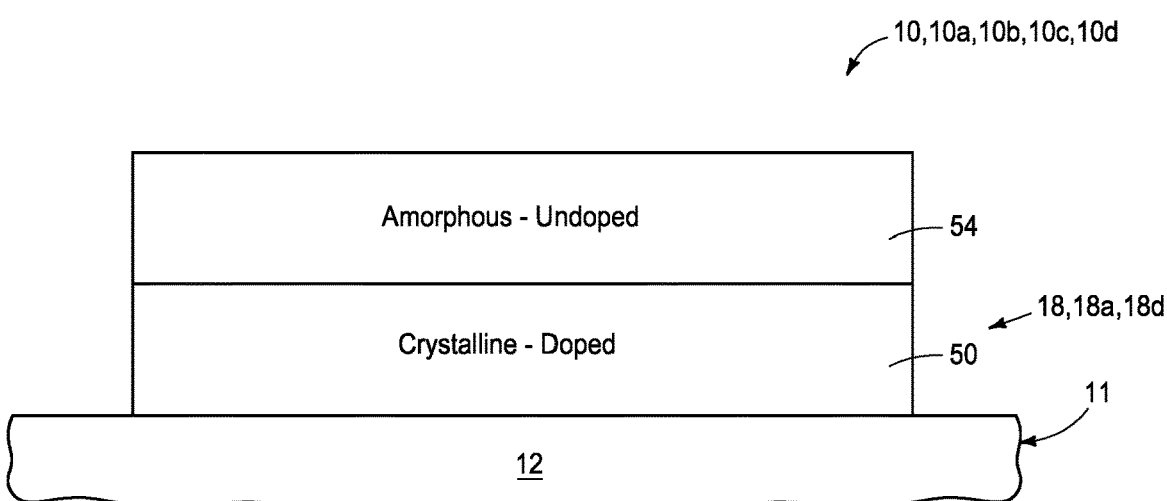

Referring to FIG. 15, middle material 54 has been formed to be amorphous. In one embodiment, middle material is undoped at least initially as-formed. The uppermost surface of bottom material 50 may be polished (e.g., by CMP) and/or a native oxide otherwise removed therefrom (e.g., by exposure to HF) prior to forming top material 52.

Figure 16:
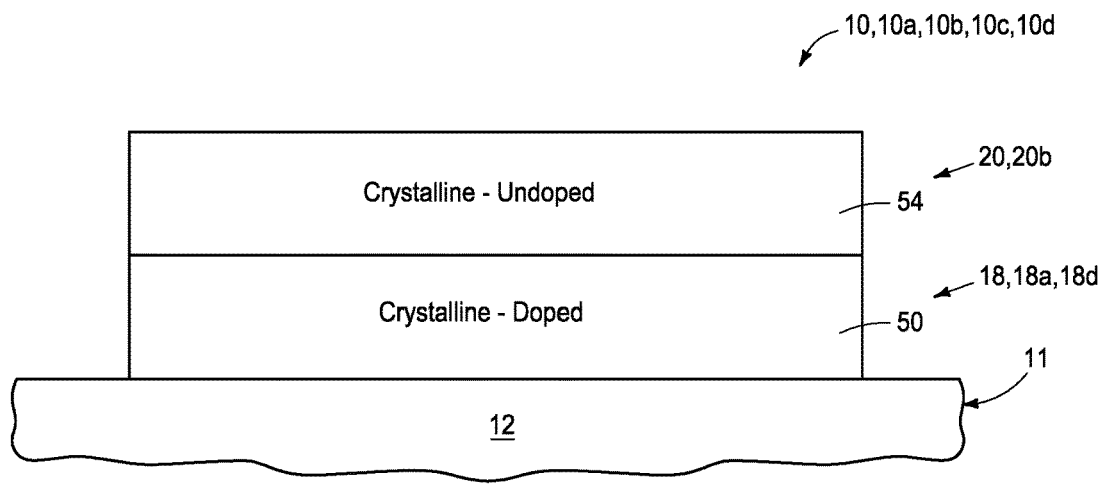

Referring to FIG. 16, at least one of the at least two time-spaced laser annealing steps has been used to melt and crystallize amorphous middle material 54 to be crystalline. Such laser annealing step is used to raise temperature of amorphous middle material 54 at least to its melting temperature and yet that is below melting temperature of bottom material 50 to cause amorphous middle material 54 and not bottom material 50 to melt. Such may occur, for example, even when materials 54 and 50 are of the same composition but for conductivity-dopant concentration where bottom material 50 is crystalline and middle material 54 is amorphous at the start of the laser annealing whereby the crystalline material has a higher melting temperature compared to that of the amorphous material. Alternately, such may occur, for example, by using different compositions for materials 54 and 50 and choosing composition for bottom material 50 to have a higher melting temperature than that of amorphous middle material 54.

Figure 17:
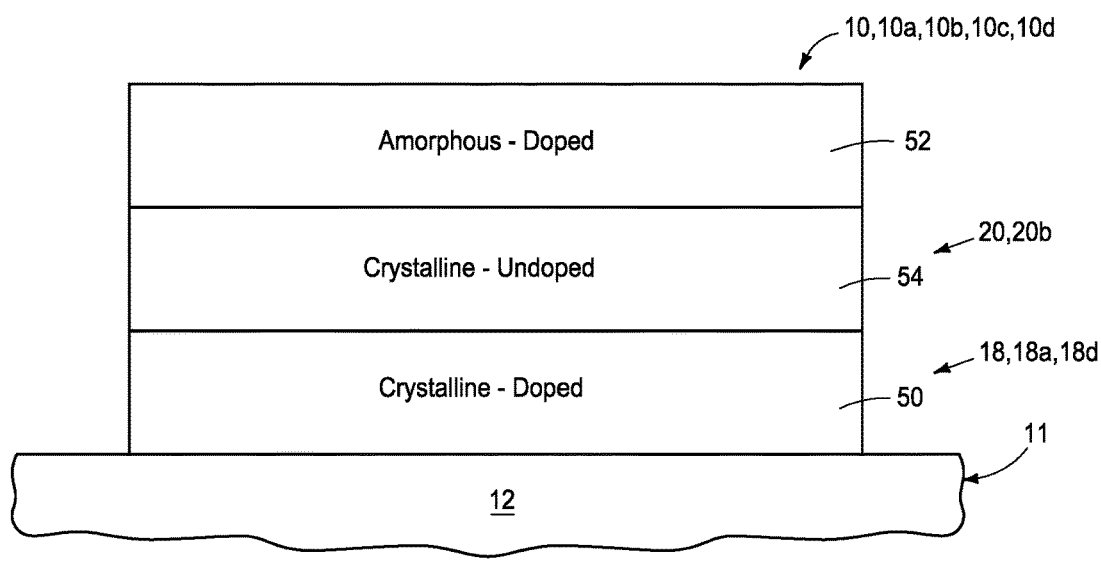

Referring to FIG. 17, top material 52 has been formed to be amorphous. In one embodiment, top material 52 is undoped at least initially as-formed. In one ideal embodiment, bottom material 50 as initially formed has conductivity-increasing dopant therein at a concentration sufficient to render such to be conductive in the finished construction of the transistor. The uppermost surface of middle material 54 may be polished (e.g., by CMP) and/or a native oxide otherwise removed therefrom (e.g., by exposure to HF) prior to forming top material 52.

Figure 18:
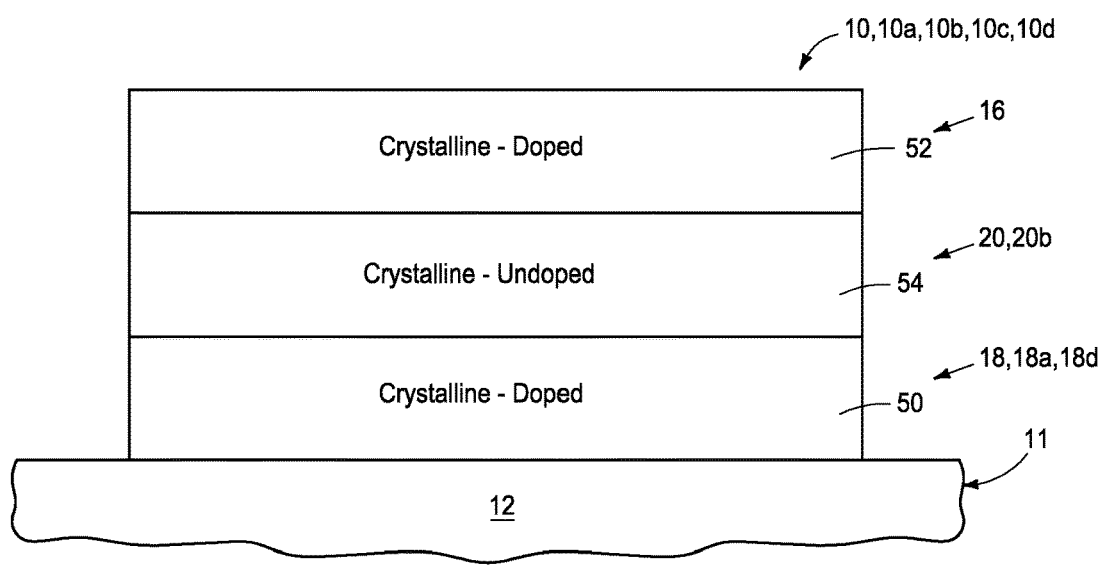

Referring to FIG. 18, a later one of the at least two time-spaced laser annealing steps has been used to melt and crystallize amorphous top material 52 to be crystalline. Such later laser annealing step is used to raise temperature of amorphous top material 52 at least to its melting temperature and yet that is below melting temperature of crystalline middle material 54 to cause amorphous top material 52 and not crystalline middle material 54 to melt. Per the above, such may occur, for example, even when materials 52 and 54 are of the same composition but for conductivity-dopant concentration where middle material 54 is crystalline and top material 52 is amorphous at the start of the laser annealing whereby the crystalline material has a higher melting temperature compared to that of the amorphous material. Alternately, such may occur, for example, by using different compositions for materials 52 and 54 and choosing composition for middle material 54 to have a higher melting temperature than that of amorphous top material 52. In one embodiment, each of the middle and top materials comprise elemental-form silicon as initially formed.

Any other attribute(s) or aspect(s) as shown and/or described herein with respect to other embodiments may be used.

In one embodiment, a method of forming a transistor (e.g., 14, 14a, 14b, 14d) comprises forming a bottom material (e.g., 50), a top material (e.g., 52), and a middle material (e.g., 54) vertically between the bottom and top materials. The bottom, top, and middle materials respectively comprise a bottom source/drain region (e.g., 18, 18a, 18d), a top source/drain region (e.g., 16, 16d), and a channel region (e.g., 20, 20b) vertically between the bottom and top source/drain regions in a finished construction of the transistor. At least one of the bottom, top, and middle materials is initially formed to be from 25% crystalline to less than 90% crystalline by volume. The initially-formed at least one material is annealed to be at least 90% crystalline by volume (i.e., to be crystalline as defined above). Ideally, the annealing comprises laser annealing although one or more other annealing techniques may be used, including laser annealing combined with one or more other annealing techniques. The annealing may form any of the bottom, top, and middle materials to have any of the crystalline structures of FIGS. 1-5. A gate insulator (e.g., 24) and a gate (e.g., 22) are formed laterally-adjacent the middle material, for example to form any of the constructions of FIGS. 1-5.

In one embodiment, the at least one of the bottom, top, and middle materials is initially formed to be from 25% crystalline to 60% crystalline by volume. In one embodiment, at least the bottom and top materials are formed to comprise conductivity-increasing dopant therein. In one embodiment, at least two of the bottom, top, and middle materials are formed to be from 25% crystalline to less than 90% crystalline by volume as initially formed, with the annealing being of such at least two of the bottom, top, and middle materials. In one such embodiment, the at least two of the bottom, top, and middle materials are formed to be from 25% crystalline to less than 60% crystalline by volume as initially formed. In one embodiment, all three of the bottom, top, and middle materials are formed to be from 25% crystalline to less than 90% crystalline by volume as initially formed, with such annealing being of such all three of the bottom, top, and middle materials.

Any other attribute(s) or aspect(s) as shown and/or described herein with respect to other embodiments may be used.

In one embodiment, a method of forming a transistor (e.g., 14, 14a, 14b, 14d) comprises forming a bottom material (e.g., 50), a top material (e.g., 52), and a middle material (e.g., 54) vertically between the bottom and top materials. The bottom, top, and middle materials respectively comprise a bottom source/drain region (e.g., 18, 18a, 18d), a top source/drain region (e.g., 16, 16d), and a channel region (e.g., 20, 20b) vertically between the bottom and top source/drain regions in a finished construction of the transistor. At least the bottom and the top materials comprise conductivity-increasing dopant therein in the finished construction of the transistor. At least one of the bottom material, the top material, and the middle material is amorphous in a non-finished construction of the transistor. Laser energy is applied (e.g., as described with respect to laser annealing above) to the amorphous at least one of the bottom material, the top material, and the middle material at a power level insufficient (e.g., no greater than 0.35 J/cm$^2$) to crystallize more than 5% by volume of the amorphous at least one of the bottom material, the top material, and the middle material. After applying the laser energy, the amorphous at least one of the bottom material, the top material, and the middle material is annealed to crystallize the at least one of the bottom, top, and middle materials to be crystalline. A gate insulator (e.g., 24) and a gate (e.g., 22) are formed laterally-adjacent the middle material, for example to form any of the constructions of FIGS. 1-5.

In one embodiment, the applying of laser energy at least reduces impurity (e.g., one or both of hydrogen or argon) from the amorphous at least one of the bottom material, the top material, and the middle material. In one embodiment, the power level crystallizes 0% to 3%, in one embodiment from 0% to 1%, by volume of the amorphous at least one of the bottom material, the top material, and the middle material. In one ideal embodiment, the power level is insufficient to crystallize any of the amorphous at least one of the bottom material, the top material, and the middle material. In one embodiment, the applying of laser energy uses only 1 laser shot and, in another embodiment. uses more than one laser shot.

Any other attribute(s) or aspect(s) as shown and/or described herein with respect to other embodiments may be used.

Methods as described herein may reduce encroachment of the top source/drain region downwardly into the channel region and thereby enable more precise control of vertical thicknesses of the top source/drain region and the channel region. Methods as described herein may result in increased average crystal grain size in the channel region and ability of optimizing operational attributes of one or more of the top source/drain region, the channel region, and the bottom source/drain region. Methods as described herein, ideally laser annealing, may facilitate forming of a plurality of vertically-elongated crystal grains that individually are directly against both of the top source/drain region and the bottom source/drain region. Methods as described herein may facilitate forming of sharp and thin interfaces between the top source/drain region and the channel region and between the bottom source/drain region and the channel region. Methods as described herein using laser annealing may reduce the thermal budget that the construction is exposed to during fabrication.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a transistor comprises a top source/drain region, a bottom source/drain region, a channel region vertically between the top and bottom source/drain regions, and a gate operatively laterally-adjacent the channel region. The channel region is crystalline and comprises a plurality of vertically-elongated crystal grains that individually are directly against both of the top source/drain region and the bottom source/drain region.

In some embodiments, a transistor comprises a top source/drain region, a bottom source/drain region, a channel region vertically between the top and bottom source/drain regions, and a gate operatively laterally-adjacent the channel region. The top source/drain region, the bottom source/drain region, and the channel region are crystalline and individually have an average crystal grain size. The average crystal grain size of the channel region is different from the average crystal grain size of at least one of the top source/drain region and the bottom source/drain region.

In some embodiments, a transistor comprises a top source/drain region, a bottom source/drain region, a channel region vertically between the top and bottom source/drain regions, and a gate operatively laterally-adjacent the channel region. The top and bottom source/drain regions have polycrystalline crystal grains and grain boundaries between immediately-adjacent of the polycrystalline crystal grains. The channel region has channel crystal grains comprising grain boundaries between immediately-adjacent of the channel crystal grains. The top source/drain region and the channel region have a top interface and the bottom source/drain region and the channel region has a bottom interface. At least 50% of the grain boundaries in the top source/drain region at the top interface are laterally offset from the grain boundaries of the channel crystal grains in the channel region at the top interface. At least 50% of the grain boundaries in the bottom source/drain region at the bottom interface are laterally offset from the grain boundaries of the channel crystal grains in the channel region at the bottom interface.

In some embodiments, a method of forming a transistor comprises forming a bottom material, a top material, and a middle material vertically between the bottom and top materials. The bottom, top, and middle materials respectively comprise a bottom source/drain region, a top source/drain region, and a channel region vertically between the bottom and top source/drain regions in a finished construction of the transistor. At least the bottom and the top materials comprise conductivity-increasing dopant therein in the finished construction of the transistor. In at least two time-spaced laser annealing steps, at least two of the bottom, top, and middle materials are laser annealed to melt and then crystallize the at least two of the bottom, top, and middle materials to be crystalline. At least one of the laser annealing steps activates the conductivity-increasing dopant that is in at least one of the at least two of the bottom, top, and middle materials. A gate insulator and a gate are formed laterally-adjacent the middle material.

In some embodiments, a method of forming a transistor comprises forming a bottom material, a top material, and a middle material vertically between the bottom and top materials. The bottom, top, and middle materials respectively comprise a bottom source/drain region, a top source/drain region, and a channel region vertically between the bottom and top source/drain regions in a finished construction of the transistor. At least the bottom and the top materials comprise conductivity-increasing dopant therein in the finished construction of the transistor. At least two of the bottom, top, and middle materials are annealed together to crystallize the at least two of the bottom, top, and middle materials to be crystalline. A gate insulator and a gate are formed laterally-adjacent the middle material.

In some embodiments, a method of forming a transistor comprises forming a bottom material, a top material, and a middle material vertically between the bottom and top materials. The bottom, top, and middle materials respectively comprise a bottom source/drain region, a top source/drain region, and a channel region vertically between the bottom and top source/drain regions in a finished construction of the transistor. The bottom material is formed to be amorphous and have conductivity-increasing dopant therein, and the middle material is formed to be amorphous. The amorphous bottom and middle materials are annealed together to crystallize the bottom and middle materials to be crystalline. The top material is formed by epitaxial growth after annealing the bottom and middle materials together. A gate insulator and a gate are formed laterally-adjacent the middle material.

In some embodiments, a method of forming a transistor comprises forming a bottom material, a top material, and a middle material vertically between the top and bottom materials. The bottom, top, and middle materials respectively comprise a bottom source/drain region, a top source/drain region, and a channel region vertically between the bottom and top source/drain regions in a finished construction of the transistor. At least one of the bottom, top, and middle materials are initially formed to be from 25% crystalline to less than 90% crystalline by volume. The initially-formed at least one material is annealed to be at least 90% crystalline by volume. A gate insulator and a gate are formed laterally-adjacent the middle material.

In some embodiments, a method of forming a transistor comprises forming a bottom material, a top material, and a middle material vertically between the bottom and top materials. The bottom, top, and middle materials respectively comprise a bottom source/drain region, a top source/drain region, and a channel region vertically between the bottom and top source/drain regions in a finished construction of the transistor. At least the bottom and the top materials comprise conductivity-increasing dopant therein in the finished construction of the transistor. At least one of the bottom material, the top material, and the middle material are amorphous in a non-finished construction of the transistor. Laser energy is applied to the amorphous at least one of the bottom material, the top material, and the middle material at a power level insufficient to crystallize more than 5% by volume of the amorphous at least one of the bottom material, the top material, and the middle material. After applying the laser energy, the amorphous at least one of the bottom material, the top material, and the middle material is annealed to crystallize the at least one of the bottom, top, and middle materials to be crystalline. A gate insulator and a gate are formed laterally-adjacent the middle material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:
1. A vertical transistor comprising:
a top source/drain region, a bottom source/drain region, a channel region vertically between the top and bottom source/drain regions, and a gate operatively laterally-adjacent the channel region;
the top and bottom source/drain regions having polycrystalline crystal grains and grain boundaries between immediately-adjacent of the polycrystalline crystal grains; the channel region having channel crystal grains having a first average crystal grain size and comprising grain boundaries between immediately-adjacent of the channel crystal grains, the top source/drain region having a second average crystal grain size, and the bottom source/drain region having a third average crystal grain size that differs from the second average crystal grain size;

the top source/drain region and the channel region having a top interface and the bottom source/drain region and the channel region having a bottom interface;

at least 50% of the grain boundaries in the top source/drain region at the top interface being laterally offset from the grain boundaries of the channel crystal grains in the channel region at the top interface; and at least 50% of the grain boundaries in the bottom source/drain region at the bottom interface being laterally offset from the grain boundaries of the channel crystal grains in the channel region at the bottom interface.

2. The vertical transistor of claim 1 wherein, at least 75% of the grain boundaries in the top source/drain region at the top interface are laterally offset from the grain boundaries of the channel crystal grains in the channel region at the top interface; and at least 75% of the grain boundaries in the bottom source/drain region at the bottom interface are laterally offset from the grain boundaries of the channel crystal grains in the channel region at the bottom interface.

3. The vertical transistor of claim 2 wherein, at least 85% of the grain boundaries in the top source/drain region at the top interface are laterally offset from the grain boundaries of the channel crystal grains in the channel region at the top interface; and at least 85% of the grain boundaries in the bottom source/drain region at the bottom interface are laterally offset from the grain boundaries of the channel crystal grains in the channel region at the bottom interface.

4. The vertical transistor of claim 1 wherein the first average crystal grain size differs relative to both the second average crystal grain size and the third average crystal grain size.

5. The vertical transistor of claim 1 wherein the first average crystal grain size differs relative to only one of the second average crystal grain size and the third average crystal grain size.

6. A vertical transistor comprising:

a top source/drain region, a bottom source/drain region, a channel region vertically between the top and bottom source/drain regions, and a gate operatively laterally-adjacent the channel region;

the top and bottom source/drain regions having polycrystalline crystal grains and grain boundaries between immediately-adjacent of the polycrystalline crystal grains; the channel region having channel crystal grains comprising grain boundaries between immediately-adjacent of the channel crystal grains;

the top source/drain region and the channel region having a top interface and the bottom source/drain region and the channel region having a bottom interface;

at least 50% of the grain boundaries in the top source/drain region at the top interface being laterally offset from the grain boundaries of the channel crystal grains in the channel region at the top interface; and at least 50% of the grain boundaries in the bottom source/drain region at the bottom interface being laterally offset from the grain boundaries of the channel crystal grains in the channel region at the bottom interface; wherein a plurality of the channel grain boundaries are vertically-elongated crystal grains that individually are directly against both of the top source/drain region and the bottom source/drain region.

7. A vertical transistor comprising:

a top source/drain region, a bottom source/drain region, a channel region vertically between the top and bottom source/drain regions, and a gate operatively laterally-adjacent the channel region;

the top and bottom source/drain regions having polycrystalline crystal grains and grain boundaries between immediately-adjacent of the polycrystalline crystal grains; the channel region having channel crystal grains comprising grain boundaries between immediately-adjacent of the channel crystal grains;

the top source/drain region and the channel region having a top interface and the bottom source/drain region and the channel region having a bottom interface;

at least 50% of the grain boundaries in the top source/drain region at the top interface being laterally offset from the grain boundaries of the channel crystal grains in the channel region at the top interface; and at least 50% of the grain boundaries in the bottom source/drain region at the bottom interface being laterally offset from the grain boundaries of the channel crystal grains in the channel region at the bottom interface; wherein, one and only one of the grain boundaries in the top source/drain region at the top interface being laterally aligned with one and only one of the grain boundaries of the channel crystal grains in the channel region at the top interface; and one and only one of the grain boundaries in the bottom source/drain region at the bottom interface being laterally aligned with one and only one of the grain boundaries of the channel crystal grains in the channel region at the bottom interface.

\* \* \* \* \*